United States Patent [19]
Goth

[11] Patent Number: 4,719,185
[45] Date of Patent: Jan. 12, 1988

[54] METHOD OF MAKING SHALLOW JUNCTION COMPLEMENTARY VERTICAL BIPOLAR TRANSISTOR PAIR

[75] Inventor: George R. Goth, Poughkeepsie, N.Y.

[73] Assignee: International Business Machines Corporation, Armonk, N.Y.

[21] Appl. No.: 856,521

[22] Filed: Apr. 28, 1986

[51] Int. Cl.$^4$ ............... H01L 21/425; H01L 21/225; H01L 21/265
[52] U.S. Cl. .................... 437/31; 357/34; 357/91; 437/33; 437/67; 437/203
[58] Field of Search ............. 29/577 C, 576 B, 578; 148/1.5, 187; 357/34

[56] References Cited

U.S. PATENT DOCUMENTS

| | | | |
|---|---|---|---|
| 3,617,827 | 11/1971 | Schmitz et al. | 317/235 |
| 3,730,786 | 5/1973 | Ghosh | 148/175 |
| 3,885,999 | 5/1975 | Fusaroli et al. | 148/175 |
| 3,930,909 | 1/1976 | Schultz et al. | 148/175 |
| 4,339,767 | 7/1982 | Horng et al. | 357/44 |
| 4,381,953 | 5/1983 | Ho et al. | 148/1.5 |
| 4,412,376 | 11/1983 | DeBar et al. | 29/576 B |
| 4,485,552 | 12/1984 | Magdo et al. | 29/577 C |
| 4,553,318 | 11/1985 | Chandrasekhac | 29/577 C |
| 4,577,397 | 3/1986 | Komatsu | 29/576 B |
| 4,641,419 | 2/1987 | Kudo | 29/591 |

FOREIGN PATENT DOCUMENTS 2428881 1/1975 Fed. Rep. of Germany.

OTHER PUBLICATIONS

IBM Technical Disclosure Bulletin, vol. 17, No. 1, Jun. 1974, pp. 21–22, Complementary Bipolar Device Structure, by J. J. Chang et al.
IBM Technical Disclosure Bulletin, vol. 22, No. 5, Oct. 1979, pp. 1874–1878, Nine-Mask Complementary Bipolar Process, by V. Y. Doo.
IBM Technical Disclosure Bulletin, vol. 16, No. 5, Oct. 1973, pp. 1630–1631, Complementary Bipolar Transistor Process Using Seven Masking Steps, by S. A. Abbas et al.
IBM Technical Disclosure Bulletin, vol. 14, No. 4, Sep. 1971, p. 1045, Complementary Transistors, by W. N. Jacobus et al.

Primary Examiner—Upendra Roy
Attorney, Agent, or Firm—T. Rao Coca

[57] ABSTRACT

Disclosed is a complementary vertical NPN and PNP pair having matched performance. The PNP collector is located deep in an epitaxial layer overlying a semiconductor substrate. The junction depths and surface concentrations of both emitters are quite similar; the junction depths and surface concentrations of bases of the complementary devices are also similar to each other. The PNP and NPN emitters are provided with self-aligned conductive contacts. A high dopant concentration equal to that in the emitters is provided in all contacts of the transistor elements to reduce the contact resistances.

Disclosed too is a process of forming the above structure. Starting with a semiconductor substrate having a blanket N+ NPN subcollector and an epitaxial layer thereon having first and second active regions, an NPN base precursor and PNP collector reach-through precursor are simultaneously implanted in the first and second active regions, respectively. PNP collector is then formed in the second active region by implanting P type species to lodge them at the bottom the epitaxial layer. PNP base precursor is then implanted in the surface region of the epitaxial layer in the second active region. By annealing, the NPN and PNP bases and PNP collector reach-through are obtained from their respective precursors. A high-dopant concentration and shallow NPN emitter and low-resistance contact region for PNP base are simultaneously implanted. PNP emitter and contact regions for PNP collector reach-through and NPN base having a concentration and junction depth similar to those of the NPN emitter are simultaneously implanted. Self-aligned conductive contacts are established with both emitters and all other transistor elements.

23 Claims, 15 Drawing Figures

METHOD OF MAKING SHALLOW JUNCTION COMPLEMENTARY VERTICAL BIPOLAR TRANSISTOR PAIR

BACKGROUND OF THE INVENTION

The invention relates to fabrication of a complementary bipolar transistor pair and, in particular, to a shallow profile vertical PNP transistor integrated with a shallow profile vertical NPN transistor wherein the gain of the pnp device is at least 10-15 (at 1 ma) and cutoff frequency is at least 1-4 GHz.

The fundamental advantage of a complementary bipolar device is its low power consumption, i.e., the amount of current that the device consumes in accomplishing the push-pull function in some driver circuit or some logic function will be extremely low compared to a noncomplementary transistor arrangement. As technology evolves toward higher chip densities and power consumption by the chip is severely limited, ways must be found to obtain the same performance with a reduced power consumption.

Many efforts have been directed at producing complementary PNP and NPN transistor pairs on a common monolithic semiconductor substrate. Generally, two problems have been encountered in producing complementary transistor pairs. First, because of the lesser mobility of holes relative to electrons, PNP transistor characteristics are inherently inferior to those of NPN transistors. PNP transistors usually have a current gain of no higher than about 10 and a cutoff frequency of no higher than about 500 MHz, whereas NPN transistors generally have a gain in excess of about 80 and cutoff frequency in excess of about 3.5 GHz. Consequently, PNP transistors, particularly the lateral PNP transistors which are inferior to vertical PNP devices, are generally used as load devices and their characteristics are not relied on as a means of determining logic speed of a logic circuit or switching speed of driver U.S. Pat. No. 3,730,786 to Ghosh and assigned to the present assignee, describes a method for fabricating a complementary pair of bipolar transistors. A significant feature of the Ghosh patent is the use of a highly doped N+ region formed at the surface of the substrate to act as a barrier for the PNP transistor device. In subsequent steps of the method of the Ghosh patent, the N+ doped region diffuses into the subsequently deposited epitaxial layer. Through ion migration and autodoping, a highly doped barrier region is formed which is superimposed over the subcollector region of the PNP transistor. The intersection of the N+ doped barrier region with the P subcollector of the PNP transistor forms a PN junction which may act to provide NPN transistor function during operation of the structure. The Ghosh patent relies upon boron diffusion to form the emitter region of the PNP emitter, but the PNP emitter contact is not self-aligned to the PNP emitter.

U.S. Pat. No. 4,485,552 to Magdo et al an assigned to the present assignee describes a method of making complementary vertical NPN and PNP transistors in which the PNP collector is formed by double diffusion of dopant into a substrate. Then, an N-type epitaxial silicon layer is formed by deposition on the substrate surface. The PNP emitter is formed by means of a P+ doped polysilicon as a dopant diffusion source. Although this process provides a shallow emitter region without effecting dislocations in the silicon lattice of the epitaxial layer, it suffers from poor base width control of the PNP device due to its dependence on epitaxial layer thickness control and P+ outdiffusion.

U.S. Pat. No. 4,412,376 to DeBar et al and assigned to the present assignee, describes a vertical PNP transistor in which the emitter is a Shottky diode contact. A structure of this type, in general, tends to have inferior device characteristics compared to a PNP transistor having a P+ doped emitter.

U.S. Pat. No. 3,930,909 to Schmitz et al, like the Magdo et al patent, features pre-epi doping of the PNP collector with differential out-diffusion in the fabrication of complementary vertical transistor pair. The emitter of the PNP device is provided with the same doping profile as the base of the NPN device resulting in poor PNP device characteristics. Additionally, the PNP emitter is not self-aligned to the PNP emitter contact.

U.S. Pat. No. 3,885,999 issued to Fusaroli et al describes a method of forming a lateral PNP transistor in conjunction with a vertical NPN transistor. The lateral PNP structure basically suffers from poor device characteristics and low gain at normal emitter current densities. A lateral PNP structure while useful as a load device in bipolar array designs, suffers from insufficient frequency response forr complementary logic applications.

U.S. Pat. No. 3,617,827 issued to Schmitz et al, like U.S. Pat. No. 3,930,909 relies on differential outdiffusion to form the P collector of a complementary vertical PNP and NPN transistor pair. The P collector is not isolated from the P substrate; the PNP emitter is not self-aligned to the PNP emitter contact; and the PNP device is required to be deeper than the NPN device. Cumulatively, these requirements result in a PNP transistor having a frequency response much inferior to that of the NPN transistor.

The German Offenlegungschrift No. 24 28 881 shows a complementary bipolar transistor pair consisting of a lateral PNP transistor and a vertical NPN device.

U.S. Pat. No. 4,339,767 to Horng et al an assigned to the present assignee addresses lateral PNP transistor integrated with a vertical NPN device. The PNP emitter and collector impurity concentration profiles are defined by out-diffusion from P+ polysilicon dopant diffusion source and the base width is lithographically defined.

IBM Technical Disclosure Bulletin entitled "Complementary Transistors" by Jacobus et al, Vol. 14, No. 4, Page 1045, September 1971 describes a double N type epitaxial silicon deposition method for forming a vertical PNP transistor. The second epitaxial layer serves as both the base of the PNP and collector of the NPN. Base doping of this structure requires a wide (at least 1 $\mu$m width) PNP base relative to that of the NPN transistor to avoid emitter-to-collector punch-through.

IBM Technical Disclosure Bulletin entitled "Complementary Bipolar Transistor Process Using Seven Masking steps" by Abbas et al, Vol. 16, No. 5, Pages 1630–1631, October 1973 describes a complementary vertical PNP transistor fabrication. The NPN has an epi-base and the collector definition is accomplished by differential outdiffusion. As a result, the problems of base width control and low emitter-collector punch-through voltage are inevitable.

IBM Technical Disclosure Bulletin entitled "Nine-Mask Complementary Bipolar Process" by Doo, Vol. 22. No. 5, pages 1874–1878, October 1979 describes a complementary vertical NPN and PNP fabrication process. The PNP transistor is composed of an up-diffusion subcollector, N-epi base and polysilicon contacts. Performance of the NPN is deliberately degraded by increasing the collector-substrate junction capacitance in order to improve the PNP device properties.

IBM Technical Disclosure Bulletin entitled "Complementary Bipolar Device Structure" by Chang et al, Vol. 17, No. 1, pages 21-22, June 1974 describes a complementary vertical transistor fabrication process. The PNP transistor resulting from this process includesm an N− substrate with up-diffused P+ subcollector, an N epi base. The PNP emitter doping is not self-aligned to the PNP emitter contact.

Thus, the prior art efforts to obtain a complementary bipolar structure with matched NPN and PNP performance characteristics invariably involve degrading the performance of the NPN to match the performance of the PNP. Another problem with the prior art methods of fabricating complementary bipolar devices is that they invariably involve additional thermal cycles over and above those required for fabrication of the NPN structure alone. These thermal cycles lead to a disruption of the NPN device fabrication making it impossible to obtain good NPN and PNP devices on the same structure. Yet another problem is that since the PNP collector is invariably formed by doping prior to the epitaxial layer deposition, this leads to lack of control of the PNP base width dimension and tolerance due to upward diffusion of the P dopant from the collector into the epitaxial layer during the growth of the epitaxial layer. This is further aggravated by the lack of precise controllability of the epitaxial layer thickness. The net result is a PNP device of significantly inferior performance than that of the NPN device.

It would be desirable to provide a complementary bipolar device pair on a common semiconductor substrate having matched high performance characteristics. It would also be desirable to provide a controllable and reliable process for forming such a complementary structure.

SUMMARY OF THE INVENTION

In accordance with the invention, is provided a novel complementary vertical NPN and PNP transistor pair having matched high performance and low power consumption characteristics. The vertical doping profile (i.e., the vertical doping concentrations in the emitter, base and collector) of the PNP is quite comparable to that of the NPN. The junction depths of the various elements of the PNP device are quite comparable to those of the NPN. In a preferred embodiment, the NPN emitter junction depth and surface concentrations are in the approximate ranges 0.3-0.4 $\mu$m and $(2-4)\times 10^{20}$ atoms/cc, respectively; the NPN base junction depth and surface concentration ranges are about 0.5-0.6 $\mu$m and $(3-4)\times 10^{18}$ atoms/cc, respectively, and is formed in about 1 $\mu$m thick epitaxial silicon layer having a surface concentration of about $1\times 10^{16}$ atoms/cc; this results in an NPN base width of about 0.1-0.3 $\mu$m; the NPN subcollector is doped to a peak surface concentration of about $1\times 10^{20}$ atoms/cc; and the NPN collector reach-through is provided with a surface concentration comparable to that of the NPN emitter and intersects the NPN subcollector at a minimum surface concentration of about $(0.7-0.8)\times 10^{18}$ atoms/cc to provide a low series resistance for the collector. The PNP emitter has a surface concentration of about $7\times 10^{19}-1\times 10^{20}$ atoms/cc and a junction depth identical to that of the NPN emitter; the junction depth and concentration of the PNP base are comparable to those of the NPN base; the PNP collector has a peak surface concentration in the range of about $5\times 10^{17}-1\times 10^{18}$ atoms/cc, depending on the required collector series resistance and has a width between about 0.5 $\mu$m and 0.6 $\mu$m; the reach-through of the PNP collector has the same dopant profile as that of the NPN base with a surface concentration equal to that of the PNP emitter to provide a low resistance PNP collector. The resulting NPN structure has a gain of about 80-100 and a cutoff frequency of about 7-9 GHz. The PNP device has a gain of about 10-20 and a cutoff frequency of about 1-3 GHz.

The fabrication of this novel structure is accomplished by a novel process in which starting with a P− silicon substrate having a blanket N+ subcollector, an N epitaxial layer is grown, followed by forming the reach-through for the N+ subcollector. Next, the precursors for the NPN base and PNP collector reach-through are simultaneously formed by boron ion implantation. PNP collector is then formed at the bottom of a selected portion of the epitaxial layer by high energy (singly or doubly ionized) boron species at a dose optimized to yield a PNP collector doping profile consistent with that of the NPN collector. Since the PNP collector is implanted from the surface of the epitaxial layer, the doping profile thereof is controlled with great precision. The PNP collector implant is deep enough into the epitaxial layer to retain a surface region for forming a shallow PNP base-emitter junction directly above it. Using a suitable mask and ion implantation, the PNP base precursor is then formed in the epitaxial layer in correspondence with the PNP collector implant. Next, a low temperature anneal is accomplished to activate the implanted species and remove implant damage followed by forming an oxidation-resistant mask. During this anneal step, the PNP and NPN bases and PNP collector reach-through are formed from their respective precursors. After making appropriate openings in the oxidation-resistant mask, N type dopant is introduced forming the NPN emitter and low resistance contact regions in the NPN collector reach-through and PNP base. If desired, suitable dielectric isolation, such as polyimide filled trench isolation, between the PNP and NPN structures may be established. An insulator mask having openings in correspondence with a portion of the PNP base, PNP collector reach-through and NPN base is formed and P dopant is introduced to simultaneously form the PNP emitter and low resistance contacts regions for the PNP collector and NPN base. Final annealing is done at a high temperature (900°-1000° C.) to drive the both the emitters to their intended final equal depth while simultaneously also controllably driving the other doped regions to their final junction depth. After making openings in the insulator mask to expose the contact areas for the remainder of the transistor elements, metallization is established. Since the same openings in the insulator used for forming the emitters are used for contact purposes, the resulting metallurgical contacts will be perfectly self-aligned.

BRIEF DESCRIPTION OF THE DRAWINGS

The novel features, elements, process steps and their combination characteristic of the invention are set forth in the appended claims. The invention, itself, however, will be best understood by reference to the detailed description which follows in conjunction with the accompanying drawings wherein:

DETAILED DESCRIPTION OF THE PREFERRED EMBODIMENT

Figure 1:
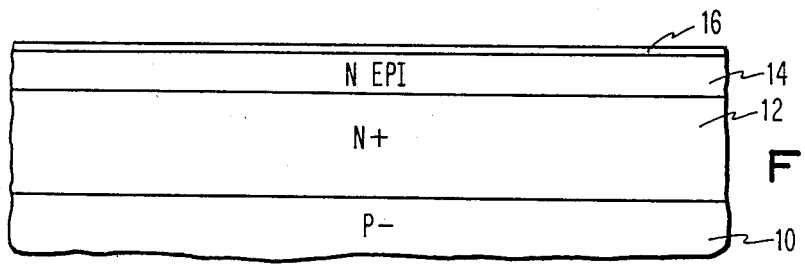
FIGS. 1-15 are flow diagrams illustrating by sequential cross-sectional representation the process of the present invention culminating in the novel matched performance complementary vertical bipolar structure shown in FIG. 15.

Referring to the drawings and in particular to FIG. 1, starting with a P− semiconductor monocrystalline silicon substrate 10 having a resistivity of 10-20 Ohm-cm, a blanket heavily doped N− subcollector 12 typically that used for a high performance NPN transistor is formed by N type (arsenic) ion implantation. Then, an N type epitaxial layer 14 is grown over the region 12. Typically, a reduced pressure is used during the epitaxial layer growth to avoid excessive N type autodoping. The thickness of the epitaxial layer 14 can be optimized depending on the desired vertical separation between base and subcollector of the NPN device and the vertical dimension of the PNP collector. For a given NPN emitter-base profile, as the thickness of the epitaxial layer 14 is increased, the vertical spacing between the NPN base and subcollector will correspondingly increase, which will degrade the NPN device performance. The preferred thickness of the layer 14 is about 1-2 $\mu$m with arsenic dopant concentration of about $2 \times 10^{16}$ atoms/cc. The epitaxial layer 14 is thermally oxidized to grow a silicon dioxide layer 16 of thickness about 150-200 nm.

Figure 2:
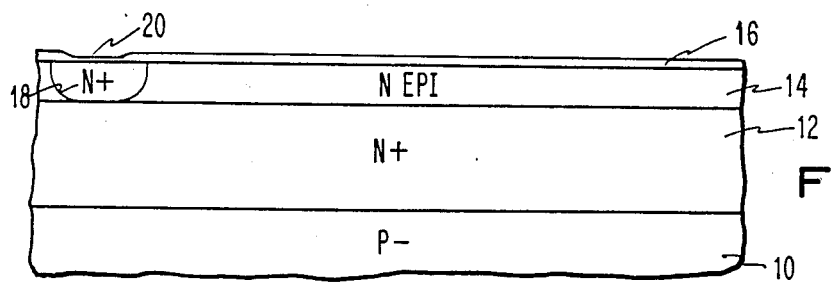
Figure 3:
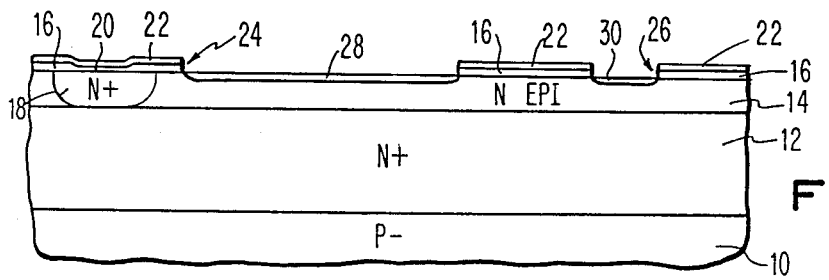

Referring to FIGS. 2 and 3, using a mask the NPN collector reach through 18 is formed by forming a window in the oxide layer 16 and introducing N type dopant therethrough into the exposed epitaxial layer 14 to intercept the N+ subcollector 12. The exposed epi layer is then reoxidized to grow a 100-150 nm oxide 20. A silicon nitride layer 22 of thickness about 80-100 nm is formed by chemical vapor deposition. Using photolithographic and etching techniques, openings 24 and 26 are formed in the dual oxide 16 and nitride 22 layer. A thin (20-30 nm thickness) screen oxide (not shown) is then formed on the epitaxial layer exposed by the windows 24 and 26. P type ions are then implanted through the screen oxide to form the NPN base precursor 28 and PNP collector reach-through precursor 30. In one example, boron ions of low energy of about 15-25 Kev and dose about $(3-4) \times 10^{14}$ ions/sq. cm. are used for forming the shallow P type regions 28 and 30.

Figure 4:
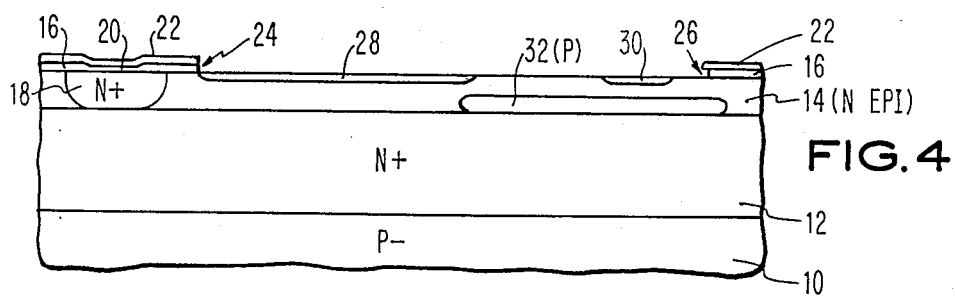

Progressing toward the structure shown in FIG. 4, a photoresist mask (not shown) having an opening in correspondence with the PNP collector region is applied. The oxide 16 and nitride 22 exposed by the opening in the photoresist mask is removed by conventional etching. Then, the PNP collector 32 is formed by high energy ion implantation deep into the epitaxial layer 14. One approach is to implant doubly ionized boron ($^{11}$B++) atoms at an energy of 170-180 Kev and dose $(1-2) \times 10^{13}$ ions/sq.cm. Another approach is to implant singly ionized boron atoms ($^{11}$B+) at an energy of 300-500 Kev and dose $5 \times 10^{13}$-$5 \times 10^{14}$ ions/sq.cm. The ion implantation dose is optimized to match the NPN device characteristics since increasing the dose lowers the PNP collector series resistance. The PNP collector implant 32 is deep enough to retain an epitaxial layer region to form a shallow base-emitter junction above it, but also form a thick enough region 32 to obtain a low sheet resistance of about 500 ohms/square. The implanted P region 32 in reality overlaps into the N+ subcollector 12 thereunder, but since the subcollector 12 is heavily doped (typically at least $1 \times 10^{20}$ atoms/cc) the P doping will not invert the subcollector. The peak of the P type implant is arranged to be near the subcollector 12 and the tail of the implant is tapered into the remainder of epitaxial layer 14. The important feature of this manner of forming the PNP collector is that the PNP collector is implanted from the same reference surface as the PNP base is implanted (as will become more apparent in due course). Consequently, the PNP doping profile can be controlled to a high degree of accuracy, enabling one skilled in the art to closely match the performance characteristics of the complementary devices.

Figure 5:
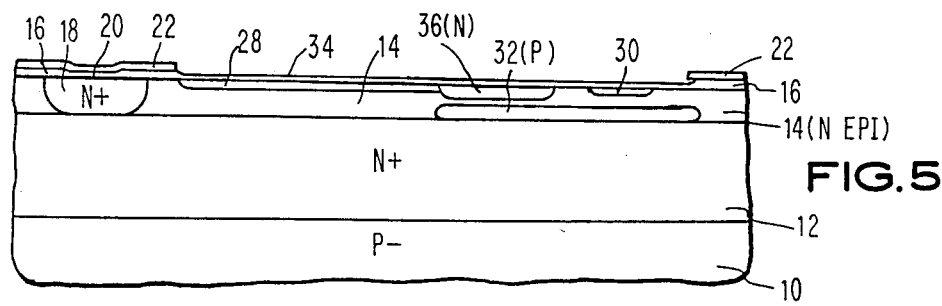
Figure 6:
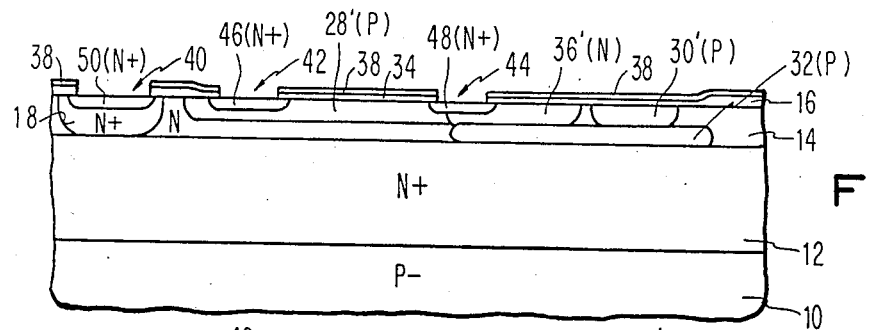

Next, referring to FIG. 5, the photoresist mask is stripped off and the regions that were defined by the NPN base and PNP collector mask are oxidized to grow a 100-150 nm thick oxide layer 34. A short anneal cycle at a low temperature of about 800°-850° C. for a time of about 60-75 mins. is accomplished to activate the implanted species and remove any damage to the silicon crystal caused by the N and P type implants. It is important that the annealing is done prior to thermal oxidation, least the implant damage is propagated during the thermal oxidation step resulting in leaky junctions. Next, a photoresist blockout mask (not shown) having an opening in correspondence with the intended PNP base region is formed on the structure. Precursor to the PNP base 36 is formed by ion implanting N type dopant through the oxide 34 in the mask opening into the exposed epitaxial layer 14. Phosphorous ($^{31}$P+) ions of energy about 120-150 Kev and dose $(1-2) \times 10^{14}$ ions/sq.cm. may be used in this step. Thereafter, as illustrated in FIG. 6, the remaining nitride 22 is removed in hot phosphoric acid followed by forming a fresh continuous coating of silicon nitride layer 38 of thickness about 80-150 nm. The thickness of the nitride layer 38 is such as to provide adequate device passivation and yet minimize any topology problems which would deleteriously affect the integrity of subsequent device contact metallization.

The next process step, illustrated in FIG. 6, is NPN emitter fabrication. At this stage of the fabrication process, the P implants are quite shallow since the NPN base anneal cycle was accomplished at a low temperature. Openings 40, 42 and 44 are formed in the nitride 38 and the underlying oxide corresponding to the NPN collector contact region, NPN emitter region and PNP base contact region, respectively. A thin (typically, 20-25 nm thickness) screen oxide (not shown) is formed on the silicon corresponding to the openings 40-44 and N type ions at a high dose are implanted to form a shallow NPN emitter 46 while simultaneously also forming highly conductive contact regions 48 and 50 for PNP base and NPN collector, respectively. Preferred NPN emitter implantation process parameters are arsenic ($^{75}$As+) ions at an energy of about 70-100 Kev and dose $(1-2) \times 10^{16}$ ions/sq.cm. The thin oxide formed prior to NPN emitter implant is essential to minimize damage of the silicon crystal in the emitter region. Particularly since the emitter is doped to a high concentration ($10^{20}$ atoms/cc or more) equal to the solid solubility limit of arsenic in silicon, the screen oxide is necessary to insure that crystal damage will not propagate. This oxide will also prevent dopant loss from the NPN emitter (and other highly doped N+ regions) due to outdiffusion during subsequent thermal steps.

After implantation of the NPN emitter 46 and the N+ contact regions 48 and 50, the structure is subjected to an anneal cycle at a high temperature of about 900°–950° C. for 50–70 mins. to drive the emitter 46 to most of its intended final depth. The dopant in the N+ contact regions 48 and 50 will simultaneously diffuse downward as well. During this high temperature process step, the PNP base precursor 36 will also diffuse downward intercepting the PNP collector 32, thereby obtaining a fully formed PNP base 36'. Likewise, the PNP collector reach-through precursor 30 will diffuse downward resulting in the PNP collector reach-through 30'. Finally, the dopant corresponding to the NPN base precursor 28 will also redistribute fully forming the NPN base 28'. Thus, in a single high temperature anneal step major redistribution of the dopant introduced into various regions of the epitaxial layer during the various prior process steps is accomplished in a controlled manner.

Figure 7:
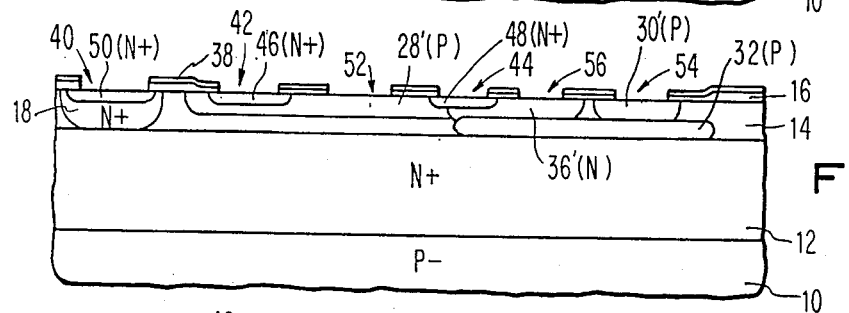

Continuing with the present process, referring to FIG. 7, next, using a P contact mask and conventional etching, all P contact openings are defined. These include the NPN base contact opening 52, PNP collector reach-through contact opening 54 and the opening 56 for ultimately forming the PNP emitter region and its self-aligned contact. During this P contact window definition step, all N contact windows 40, 42, 44 are protected by a photoresist mask. The photoresist is then stripped.

Figure 8:
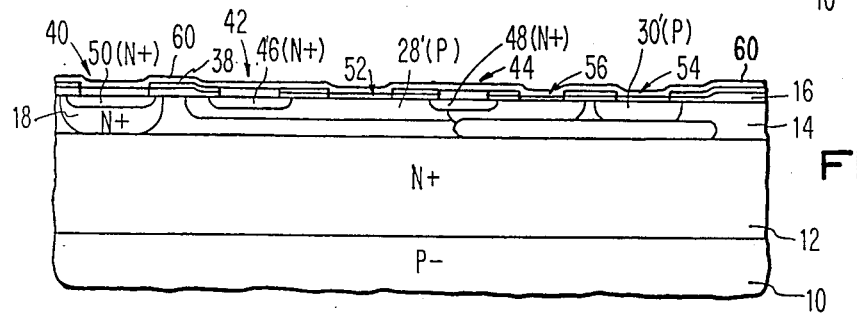

Next as illustrated in FIG. 8, all the contact regions are thermally oxidized to grow oxide layers of different thickness in the various doped layers utilizing the differential oxidation rate of these doped areas. Specifically, since the P contacts have a relatively low (boron) doping, typically about two orders of magnitude lower than the (arsenic doped) N+ contact regions and the oxidation rate of the N+ doped regions is about 3–4 times higher than that of the P doped regions, the oxide grown in the P contacts will be 3–4 times smaller than that in the N+ contact windows. The oxide grown in the N doped region corresponding to the window 56 will be approximately that corresponding to the P contact windows due to the relatively low dopant concentration of this N region. For example, by subjecting the structure to thermal oxidation at a temperature of about 900° C. the oxide grown in the P contact windows 52 and 54 will be approximately 30 nm; that grown in the N contact window 56 will be approximately 35 nm; and that grown in the N+ contact windows 40, 42 and 44 will be approximately 140 nm. In other words approximately 100 nm thicker oxide is formed in the N+ contact regions relative to all other contact regions.

After forming a nonuniform thickness oxide layer in this manner, a thin (about 50 nm thickness) layer of silicon nitride 60 is deposited to protect all contacts from oxidation during a subsequent thermal oxidation step.

Figure 9:
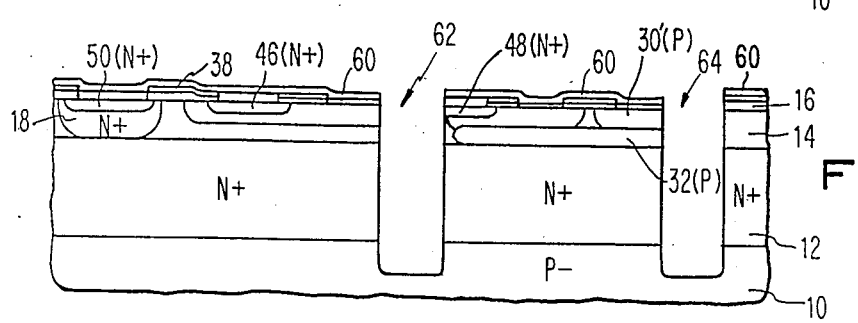
Figure 10:
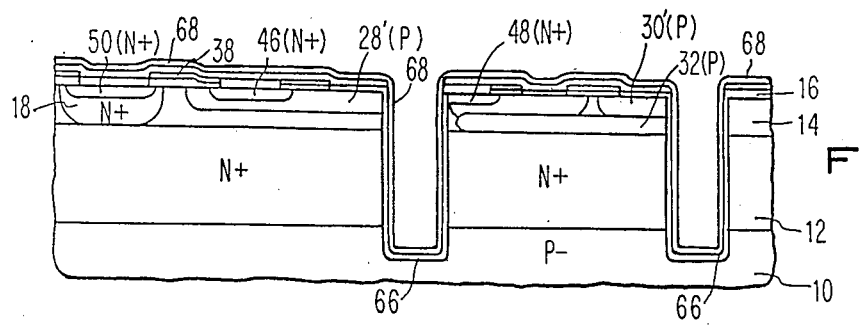

Referring next to FIGS. 9 and 10, dielectric isolation is formed between the NPN and PNP devices to prevent latch-up between adjacent devices on the chip. The preferred dielectric isolation scheme is deep polysilicon- or polyimide-filled trench isolation since such a scheme not only provides an effective isolation by preventing lateral parasitic device formation, but also maintains good surface planarity. Many well-known techniques may be employed for the trench formation, such as illustrated in U.S. Pat. No. 4,381,953 issued to Ho et al or the improved technique disclosed in U.S. patent application Ser. No. 566,593 entitled "Trench Etch Process for Dielectric Isolation" by Goth et al, both assigned to the present assignee. These documents are hereby incorporated by reference herein. Briefly, the structure is coated with a photoresist layer having openings corresponding to the trench pattern. By anisotropic reactive ion etching (RIE) deep and narrow trenches 62 and 64 are formed by etching through the N type epitaxial layer 14, the N+ subcollector 12 and into the P− substrate 10. The photoresist is stripped and the horizontal and vertical surfaces of the trenches 62 and 64 are oxidized to grow an oxide liner 66 of thickness 80–100 nm followed by deposition of a thin (80–100 nm thickness) nitride layer 68. The purpose of the nitride layer 68 is to prevent mobile ion contamination of the device region and the field region underneath the isolation. The thin oxide liner 66 underneath the nitride 68 is used to release nitride film stress. During the formation of the oxide 66, since all the contacts are masked by the nitride layer 60, no oxidation of contacts will occur as previously alluded. The deposition of nitride 68 will increase the thickness of the nitride 60 to the combined thickness of layers 60 and 68.

Figure 11:
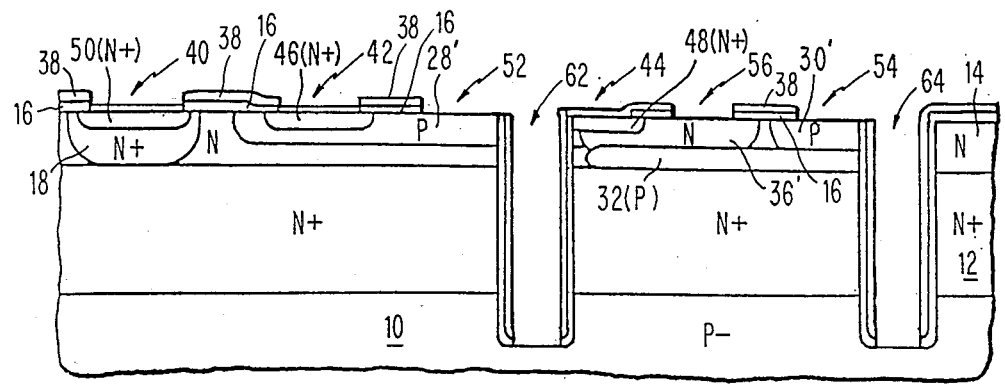

After the trenches are completely passivated by the nitride/oxide layers, as illustrated in FIG. 11, using anisotropic RIE the nitride layer(s) 68 (and 60) over all the horizontal surfaces is removed. This is followed by removal of the thin oxide layer 66 on the trench floors and the oxide in the P contact windows 52 and 54 and N contact/emitter window 44. As previously explained since a thicker oxide was formed in the N+ contact windows 40, 42 and 44 the present oxide removal step will remove only a portion of the oxide in correspondence with these windows while retaining at least 100 nm thick oxide therein as illustrated in FIG. 11.

Figure 12:
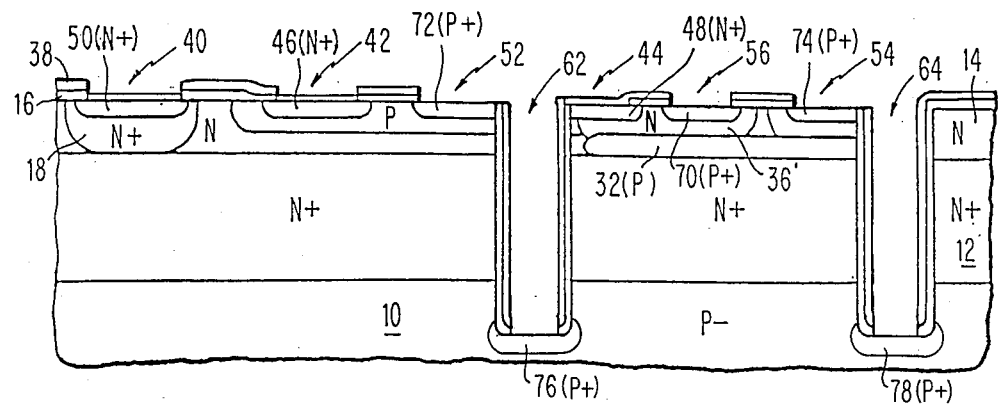

The next step in the present process is simultaneous formation of PNP emitter and high conductivity P contacts by diffusion of P type dopant through the windows 52, 54 and 56. Referring to FIG. 12, this is accomplished by $BBr_3$ deposition and diffusion to form a shallow PNP emitter 70 having a junction depth quite comparable to that of the NPN emitter 46, in the range of about 0.3–0.4 $\mu$m. The boron introduced via the windows 52 and 54 form the highly conductive P contact regions 72 and 74 for the NPN base and PNP collector reach-through, respectively. The P dopant concentration in the PNP emitter 70 is adjusted to match the dopant concentration level present in the NPN emitter 46, typically, close to about $1 \times 10^{20}$ atoms/cc, to obtain matched performance of the two complementary transistors. This P doping step also forms channel stops 76 and 78 at the bottom of the trenches 62 and 64, respectively.

Figure 13:
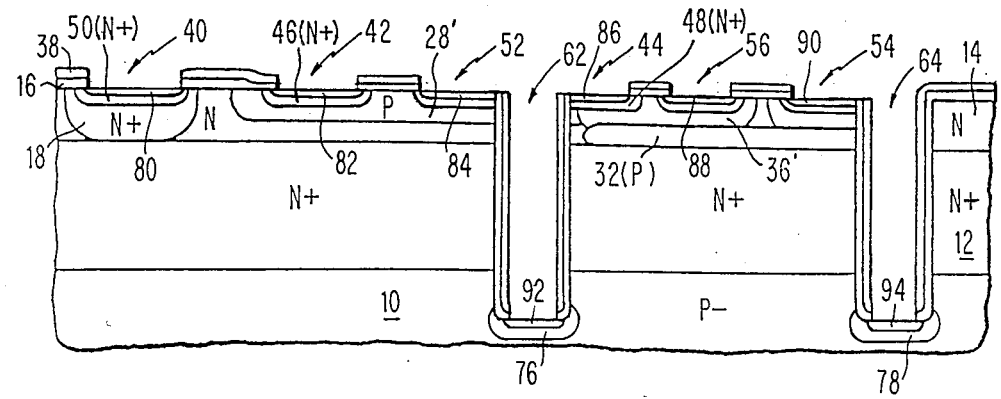

Thereafter, the oxide layer in the N+ contact areas (i.e., in the areas corresponding to windows 40, 42 and 44) is removed by wet etching thereby exposing all the contact areas. Next, referring to FIG. 13, a thin layer of an appropriate metal is blanket deposited on the whole structure including the bottom of the trenches by sputter deposition. A silicide forming metal selected from the group comprised of platinum, palladium and the like is used. The preferred metal with a thickness in the range of 30–100 nm is platinum. The structure is then heated at about 550° C. to produce platinum silicide layer by sintering wherever the platinum layer contacts silicon. Unreacted platinum is removed by wet etching using aqua regia. FIG. 13 shows the result of such process where 80, 82 and 84 designate the platinum silicide contacts corresponding to the NPN collector, emitter and base, respectively; 86, 88 and 90 designate the platinum silicide contacts to the PNP base, emitter and collector, respectively; and 92 and 94 designate the platinum silicide contacts formed to the channel stoppers 76 and 78, respectively. Since the same windows (42 and 56) in the oxide/nitride mask used for forming the NPN and PNP emitters are utilized for establishing the silicide contacts with these transistor elements, the two emitter contacts are perfectly self-aligned with their respective emitters.

Figure 14:
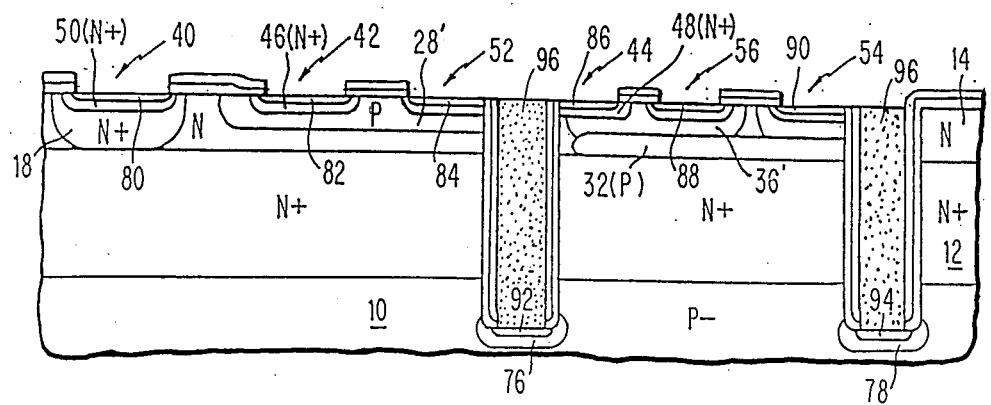

The trenches 62 and 64 are then filled with a suitable dielectric material. Typically, polyimide material 96 is spin applied to fill the trenches. It is baked out at about 400° C. and reactive ion etched in an oxygen plasma to obtain the structure depicted in FIG. 14.

Figure 15:
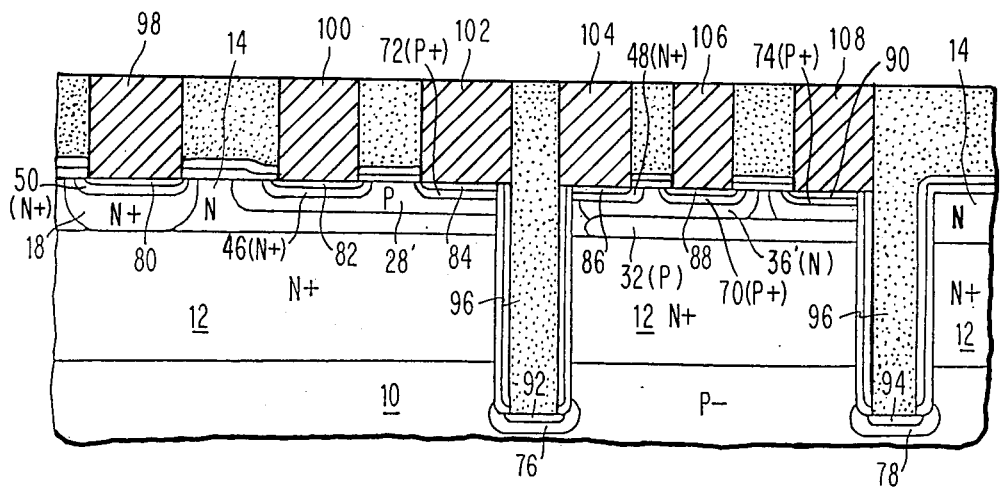

Electrical contacts are then made to the various elements of the PNP and NPN transistors by conventional deposition, lithography and etching techniques. Referring to FIG. 15, the contacts corresponding to the NPN collector, emitter and base are designated by 98, 100 and 102, respectively; the electrical contacts corresponding to the PNP base, emitter and collector are 104, 106 and 108, respectively.

In this manner, a complementary vertical transistor structure having closely matched performance characteristics is formed. Referring to FIG. 15, the resulting final structure is composed of an NPN emitter 46 having a shallow junction depth of about 0.3-0.4 $\mu$m with a surface concentration of $(2-4) \times 10^{20}$ atoms/cc; and NPN base 28' having a junction depth of about 0.5-0.6 $\mu$m and surface concentration of $(3-4) \times 10^{18}$ atoms/cc; NPN base width of about 0.1-0.3 $\mu$m; the N+ subcollector 12 is doped to a peck concentration of about $1 \times 10^{20}$ atoms/cc and the epitaxial layer 14 is about 1-2 $\mu$m thick with a surface concentration of about $1 \times 10^{16}$ atoms/cc; the NPN collector reach-through 18 has a surface concentration equal to that of emitter 46 providing a low series resistance to the NPN collector. The vertical PNP transistor is composed of an emitter 70 which has a shallow junction quite comparable, if not identical, to that the NPN emitter 46 and a concentration of about $7 \times 10^{19} - 1 \times 10^{20}$ atoms/cc; the junction depth and concentration of the PNP base 36' are comparable to those of the NPN base 28; the PNP collector 32 has a peak surface concentration of about $(5-50) \times 10^{17}$ atoms/cc and has a width between about 0.5 $\mu$m and 0.6 $\mu$m. The reach-through 30' for the PNP collector 32 has the same general concentration profile as the NPN base 28' with a surface concentration in the contact area equal to that of the PNP emitter providing a series low resistance contact to the PNP collector. The gain of the NPN device having the above profile is in the range of 80-100 and the cutoff frequency is about 7-9 GHz. The gain of the PNP device is about 10-20 and its cutoff frequency is about 1-3 GHz.

From a process standpoint, since the PNP collector 32 is formed after forming the NPN subcollector 12 and depositing the N epitaxial layer 14 by implantation through the epitaxial layer, this process does not cause any dislocations, voids or counterdoping of the N epitaxial layer characteristic of the prior art. Also, since the PNP collector 32 is implanted from the surface of the N epitaxial layer 14, the doping profile of the PNP collector can be very accurately controlled. Likewise, since the PNP base 36' and emitter 70 are also formed by implantation or diffusion of dopant from the same reference surface (surface of layer 14), the junction depths and profiles of these elements of the transistor can be accurately ascertained and controlled.

Thus, there has been described a complementary bipolar fabrication process and structure which fully satisfies the objects and advantages set forth.

While the invention has been described in conjunction with a preferred embodiment, it is evident that many alternatives, modifications and variations will be apparent to those skilled in the art. It is therefore contemplated that the appended claims will embrace any such alternatives, modifications and variations as fall within the true spirit and scope of the invention.

What is claimed is:

1. Process for forming an integrated circuit structure including a complementary pair of vertical bipolar transistor comprising;

providing a semiconductor substrate having first and second active regions formed of an epitaxial layer thereon;

simultaneously forming, by a first conductivity type ion implantation, precursors of a first transistor base and a second transistor collector reach-through in said first and second regions, respectively;

forming the collector of said second transistor by deep second conductivity type ion implantation into said second active region;

forming a base precursor of said second transistor in correspondence with a portion of said second transistor collector by selective first conductivity type ion implantation of said second active region;

forming, by selective first conductivity type doping, emitter of said first transistor in a surface portion of said first transistor base precursor;

annealing to simultaneously form first and second transistor bases and second transistor collector reach-through from their respective precursors; and forming, by selective second conductivity type doping, emitter of said second transistor in a surface portion of said second transistor base.

2. The process as recited in claim 1 wherein said first conductivity type is N type and said first transistor is NPN transistor and said second conductivity type is P type and said second transistor is PNP transistor.

3. The process as recited in claim 2 further comprising forming a subcollector for said NPN transistor on a surface portion of said substrate by N type blanket doping prior to forming of said epitaxial layer.

4. The process as recited in claim 3 further comprising forming a reach-through for said NPN subcollector by selective doping of a vertical portion said first active region.

5. The process as recited in claim 4 wherein said deep P type implant is accomplished to form the bottom of said PNP collector at the interface of said NPN subcollector and said epitaxial layer.

6. The process as recited in claim 5 wherein the P dopant concentration in said PNP collector is maximum at said interface.

7. The process as recited in claim 5 wherein said P type ion implantation is accomplished by using doubly ionized boron atoms at a high energy.

8. The process as recited in claim 6 wherein said annealing is accomplished to permit interception of said PNP base with said PNP collector.

9. Method for forming complementary vertical NPN and PNP transistor structure comprising:
   (a) providing a semiconductor substrate having first and second active regions formed of an N type epitaxial layer thereon;
   (b) simultaneously forming NPN base precursor and PNP collector reach-through precursor in said first and second active regions, respectively;
   (c) forming PNP collector by implanting P type species to lodge said species in said second region at the bottom of said epitaxial layer;
   (d) forming PNP base precursor in said second active region;
   (e) annealing to simultaneously form PNP and NPN bases and PNP reach-through from their respective precursors;
   (f) simultaneously forming, by selective N type doping, NPN emitter and a low resistance contact region for said PNP base;
   (g) forming deep dielectric-filled trenches in said substrate to isolate the first active region from said second active region; and
   (h) simultaneously forming, by selective P type doping, PNP emitter and low resistance contacts for said PNP collector reach-through and NPN base.

10. The method as recited in claim 9 further comprising forming a subcollector for said NPN transistor on a surface portion of said substrate by blanket N type doping prior to forming said epitaxial layer.

11. The method as recited in claim 10 further comprising forming a reach-through for said NPN subcollector by selective N doping of a portion of said active region.

12. The method as recited in claim 11 wherein said step for forming NPN emitter includes forming a low resistance contact region for said NPN subcollector reach-through.

13. The method as recited in claim 12 further comprising:
   forming after said step (e) an insulator layer on the resulting structure;
   making in said insulator layer openings in correspondence with said NPN emitter and contact regions for said PNP base and NPN subcollector reach-through.

14. The method as recited in claim 13 further comprising:
   forming after said step (f), openings in said insulator layer in correspondence with said PNP emitter and contact regions for said PNP collector reach-through and NPN base.

15. The method as recited in claim 14 further comprising thermally oxidizing to grow oxide in the regions of said substrate exposed by said openings in said insulator layer wherein the thickness of said oxide grown in the openings in correspondence with the NPN emitter and contact regions for the NPN subcollector reach-through and PNP base is substantially thicker than the oxide grown in said openings in correspondence with the PNP emitter and contact regions for PNP collector reach-through and NPN base.

16. The method as recited in claim 15 further comprising etching to remove the oxide grown in the openings of said insulator in correspondence with the PNP emitter and contact regions for PNP collector reach-through and NPN base prior to said step (h) while maintaining a substantial thickness oxide in the openings in said insulator in correspondence with NPN emitter and contacts for NPN collector reach-through and PNP base.

17. The method as recited in claim 16 further comprising:
   removing said substantial thickness oxide following said step (h); and
   establishing self-aligned conductive contacts with said PNP and NPN emitters and bases and said PNP collector reach-through and NPN subcollector reach-through.

18. The method as recited in claim 16 wherein said oxide grown in the openings in said insulator in correspondence with said NPN emitter and contacts for NPN collector reach-through and PNP base is about 3-4 times thicker than that grown in the openings in said insulator in correspondence with said PNP emitter and contact regions for PNP collector reach-through and NPN base.

19. Method for forming complementary vertical PNP and NPN transistor pair comprising:
   providing a silicon substrate having first and second active regions formed of an N type monocrystalline epitaxial silicon layer thereon and an N+ subcollector in said first active region directly beneath said epitaxial layer;
   forming a reach-through for said N+ subcollector by introducing N type dopant into a selected vertical portion of said epitaxial layer in said first active region;
   introducing P type dopant into a surface portion of said epitaxial layer in said first and second active regions forming precursors of NPN base and PNP collector reach-through, respectively;
   selectively implanting N type ions into the surface portion of said epitaxial layer in said second active region to form precursor of PNP base;
   using a mask having an opening in correspondence with said second active region ion implanting high energy P type species to lodge said species in said second active region at the bottom of the epitaxial layer therein;
   annealing to form the (1) NPN base from the NPN base precursor; (2) PNP base from the PNP base precursor; and (3) PNP collector reach-through from the PNP collector reach-through precursor;
   forming an insulator mask having an openings in correspondence with portions of said NPN base, PNP base and said NPN subcollector reach-through;
   introducing N type dopant through said openings in said insulator mask forming a high N+ dopant surface concentration NPN emitter and contact regions for the PNP base and NPN subcollector reach-through;
   forming openings in said insulator layer to expose portions of said PNP base and PNP collector reach-through and a second portion of said NPN base;
   growing by thermal oxidation a thick oxide on said NPN emitter and contact regions for PNP base and NPN subcollector reach-through and a thin oxide on said portions of PNP base and collector reach-through and said second portion of said NPN base;
   forming deep dielectric-filled trenches to electrically isolate said first and second active regions;

etching away said thin oxide to expose said portions of PNP base and collector reach-through and said second portion of NPN base, while substantially maintaining said thick oxide; and introducing P type dopant to form a high P dopant concentration PNP emitter in said exposed portion of PNP base and low resistance contact regions in said portion of PNP collector reach-through and said second portion of NPN base.

20. The method as recited in claim 19 further comprising forming self-aligned contacts with said PNP and NPN emitters.

21. The method as in claim 19 where the dopant concentration of said PNP emitter is in the range of about $(5-10) \times 10^{19}$ atoms/cc.

22. The method as recited in claim 19 wherein the dopant concentration of said NPN emitter is in the range of about $(2-4) \times 10^{20}$ atoms/cc.

23. The method as recited in claim 19 wherein said PNP and NPN emitters have a similar junction depth in the range of about 0.3–0.4 $\mu$m.

* * * * *